US012787528B2

(12) United States Patent

Lopez-Julia et al.

(10) Patent No.: US 12,787,528 B2

(45) Date of Patent: Nov. 3, 2026

(54) CHIP-SCALE PACKAGE LED WITH DUAL COMPOSITE REFLECTORS

(71) Applicant: LUMILEDS LLC, San Jose, CA (US)

(72) Inventors: Antonio Lopez-Julia, Vaals (NL); Konstantin Andreas Engeter, Singapore (SG); Erik Young, San Jose, CA (US); Jeff DiMaria, Scotts Valley, CA (US)

(73) Assignee: LUMILEDS LLC, San Jose, CA (US)

( * ) Notice: Subject to any disclaimer, the term of this patent is extended or adjusted under 35 U.S.C. 154(b) by 310 days.

(21) Appl. No.: 18/753,539

(22) Filed: Jun. 25, 2024

(65) Prior Publication Data

US 2025/0393347 A1 Dec. 25, 2025

(51) Int. Cl.

| | |
|---|---|
| ***H10H 20/857*** | (2025.01) |
| ***H10H 20/01*** | (2025.01) |
| ***H10H 20/812*** | (2025.01) |
| ***H10H 20/813*** | (2025.01) |
| ***H10H 20/824*** | (2025.01) |
| ***H10H 20/856*** | (2025.01) |

(52) U.S. Cl.

CPC ........ *H10H 20/857* (2025.01); *H10H 20/013* (2025.01); *H10H 20/812* (2025.01); *H10H 20/813* (2025.01); *H10H 20/824* (2025.01); *H10H 20/856* (2025.01); *H10H 20/0364* (2025.01)

(58) Field of Classification Search

CPC .. H10H 20/857; H10H 20/013; H10H 20/813; H10H 20/824; H10H 20/812; H10H 20/856; H10H 20/0364

USPC .......................................................... 257/79

See application file for complete search history.

(56) References Cited

U.S. PATENT DOCUMENTS

| | | |
|---|---|---|
| 11,456,404 B2 | 9/2022 | Enzmann et al. |
| 2009/0146165 A1 | 6/2009 | Hasnain et al. |

(Continued)

FOREIGN PATENT DOCUMENTS

| | | |
|---|---|---|
| CN | 105374920 A | 3/2016 |
| WO | 2023/235312 A1 | 12/2023 |

OTHER PUBLICATIONS

From the EPO as the ISA, "Notification of Transmittal of the International Search Report and the Written Opinion of the International Searching Authority, or the Declaration", PCT/US2025/034534, Oct. 9, 2025, 10 pages.

*Primary Examiner* — Igwe U Anya

(57) ABSTRACT

An LED includes a first composite layer on a first of its doped layers. Primary vias extend through the first composite layer, through the first doped layer and active region of the LED, and into a second doped layer thereof. A second composite layer (TCO, dielectric, multilayer reflector, and metal layers) is positioned on the second doped layer within the primary vias, on lateral surfaces of the primary vias, and on portions of the first composite layer. A dielectric spacer layer separates the first composite layer, the first doped layer, and the active region from the second composite layer. The TCO layer includes embedded electrical contact areas outside the primary vias, each being separated from the first doped layer by the first composite layer and the dielectric spacer layer. The second composite layer within the primary vias increases LED luminance (by reducing absorption, increasing reflectivity, and reducing darkening or dimming).

20 Claims, 5 Drawing Sheets

(56) References Cited

U.S. PATENT DOCUMENTS

| | | | |
|---|---|---|---|
| 2018/0342650 A1 | 11/2018 | Yang et al. | |
| 2019/0027654 A1 | 1/2019 | Hoppel et al. | |
| 2024/0204139 A1 | 6/2024 | Strozecka-Assig et al. | |
| 2025/0169243 A1 * | 5/2025 | Engeter .................. | H10H 20/01 |

* cited by examiner

CHIP-SCALE PACKAGE LED WITH DUAL COMPOSITE REFLECTORS

FIELD OF THE INVENTION

The field of the present invention relates to semiconductor light-emitting diodes (LEDs). In particular, chip-scale package LEDs are disclosed with dual composite reflectors.

BACKGROUND

An example of a conventional chip-scale package (CSP) semiconductor light-emitting diode (LED) 10 is shown in the cross section of FIG. 1. An active region 13 is positioned between a p-doped semiconductor layer 20 and an n-doped semiconductor layer 40. Radiative recombination at the active region 13 of charge carriers of an LED drive current result in light being emitted by the active region 13. The emitted light propagates in the p-doped layer 20 and the n-doped layer 40; the surface 15 of the n-doped layer 40 (corrugated in the examples shown) is the intended output surface of the LED 10.

A transparent dielectric layer 22, a multilayer reflector MLR) layer 23, and a metal layer 24 form a composite reflector on the p-doped layer 20. The composite reflector is arranged to reflect light emitted by the active region 13 that propagates within the p-doped layer 20 to propagate toward the output surface 15 of the n-doped layer 40. A plurality of primary p-vias 30 enable current to flow between the p-doped layer 20 and the metal layer 24. Each primary p-via 30 extends through the dielectric layer 22 and the MLR layer 23 and is at least partly filled with material of the metal layer 24, so as to form a localized, often circumscribed area where the metal layer 24 is in electrical contact with the p-doped layer 20. A thin layer 21 of a transparent conductive oxide (TCO; e.g., indium tin oxide (ITO) or indium zinc oxide (IZO)) establishes electrical contact between the metal layer 24 and the p-doped layer 20 within the primary p-via 30, and extends laterally between the dielectric layer 22 and the p-doped layer 20 to spread current flowing through the primary p-via 30 over a wider area of the p-doped layer 20.

A plurality of n-vias 50 extend through the metal layer 24, the MLR layer 23, the dielectric layer 22, the TCO layer 21, the p-doped layer 20, and the active region 13, and partly into the n-doped layer 40. A transparent dielectric spacer layer 60 is formed over the metal layer 24 and extends into the n-via 50, covering its side walls but leaving exposed an area of the n-doped layer 40 at the bottom of the n-via 50. A metal layer 44 is formed over portions of the spacer dielectric layer 60 and at least partly fills the n-vias 50, so that the metal layer 44 is in direct electrical contact with the n-doped layer 40 within a localized, often circumscribed area within each n-via 50. That direct electrical contact enables current flow between the n-doped layer 40 and the metal layer 44, so that the metal layer 44 can serve as an electrical contact for the n-doped layer 40.

A metal layer 34 is formed on portions of the spacer dielectric layer 60 separate from the metal layer 44, so that the metal layers 34 and 44 are electrically isolated from each other. A plurality of secondary p-vias 35 extend through the spacer dielectric layer 60 and are at least partly filled with material of the metal layer 34, so that the metal layer 34 is in direct electrical contact with the metal layer 24. That direct electrical contact enables current flow between the p-doped layer 20 and the metal layer 34, via the metal layer

24 and the TCO layer 21, so that the metal layer 34 can serve as an electrical contact for the p-doped layer 20.

SUMMARY

An inventive light-emitting diode (LED) includes a diode structure, first and second composite layers, a dielectric spacer layer, and a set of primary vias. The diode structure includes first and second doped semiconductor layers and an active region between them that emits light resulting from radiative recombination of charge carriers of an LED drive current. A surface of the second doped semiconductor layer forms a light-output surface of the diode structure. The first composite layer is positioned directly on the first doped layer and is structured so as to act as an electrical contact to the first doped layer and as an optical reflector. Each of the primary vias extends through the first composite layer, the first doped layer, and the active region, and partly into the second doped layer. The second composite layer is positioned directly on the second doped layer within the one or more primary vias, on lateral surfaces of the primary vias, and on portions of the first composite layer outside the primary vias. The second composite layer is structured to act as an electrical contact to the second doped layer and as an optical reflector, and includes a transparent conductive oxide (TCO) layer directly on and in direct electrical contact with the second doped layer within the one or more primary vias, a dielectric layer directly on the TCO layer, a multilayer reflector (MLR) layer directly on the dielectric layer, and a metal layer directly on the MLR layer. The dielectric spacer layer separates the first composite layer, the first doped layer, and the active region from the second composite layer. The TCO layer of the second composite layer includes one or more embedded electrical contact areas outside the one or more primary vias, with each embedded electrical contact area being separated from the first doped layer by portions of the first composite layer and the dielectric spacer layer.

Objects and advantages pertaining to chip-scale package LEDs may become apparent upon referring to the example embodiments illustrated in the drawings and disclosed in the following written description or appended claims.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Figure 1:
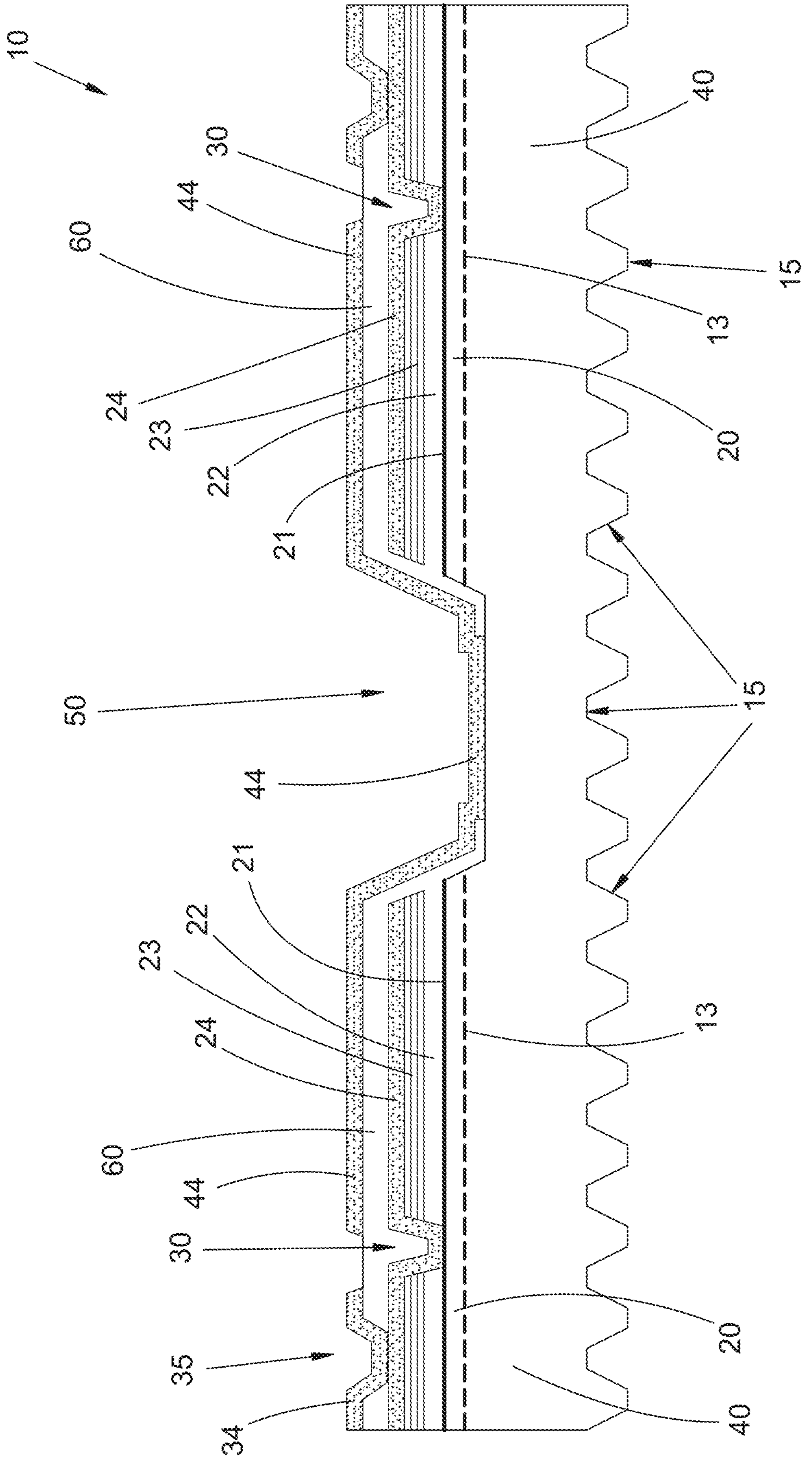
FIG. 1 PRIOR ART
FIG. 1 is a schematic cross-sectional view of an example of a conventional chip-scale package LED.
Figure 2:
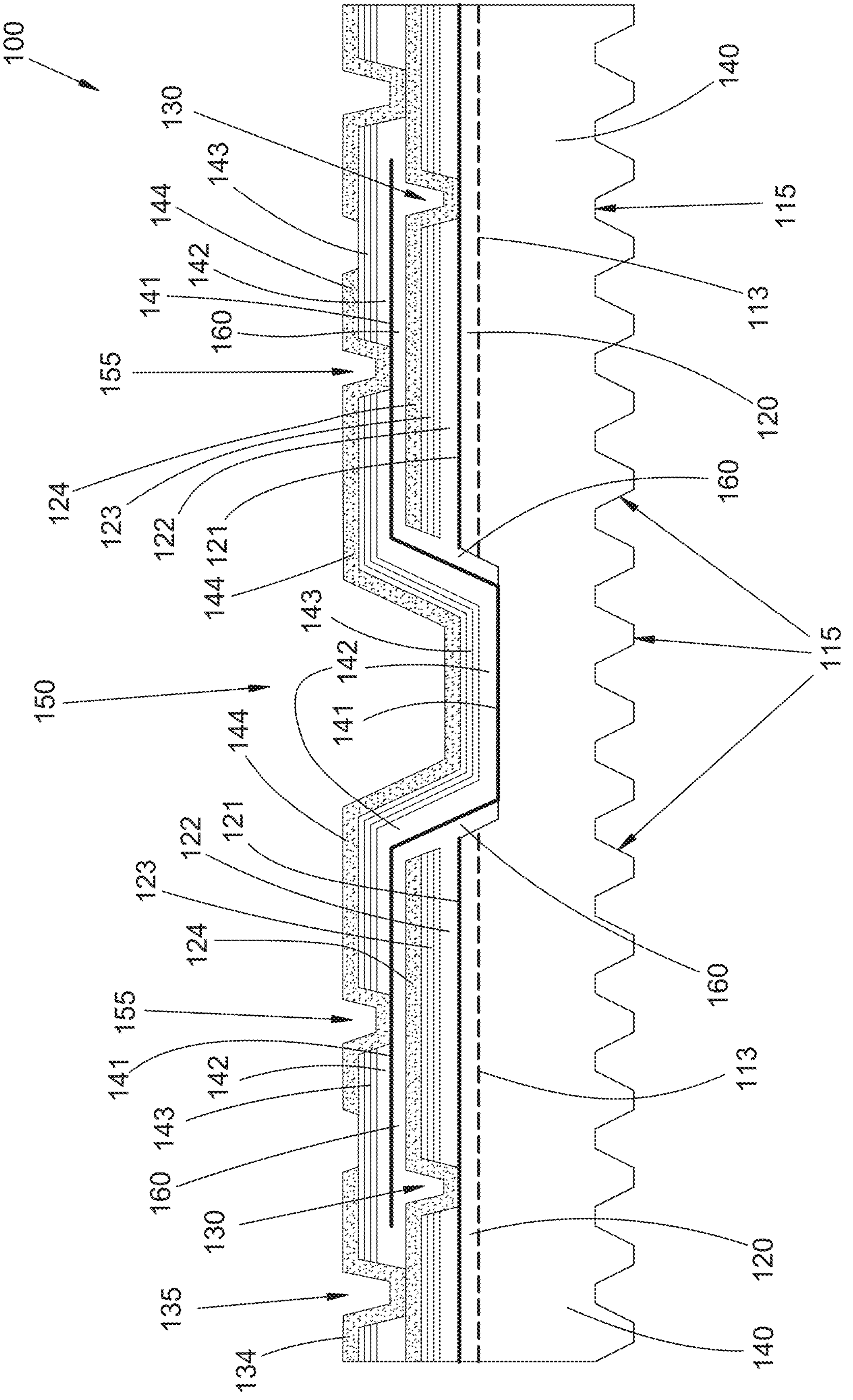
FIG. 2 is a schematic cross-sectional view of a first example of an inventive chip-scale package LED.
Figure 3:
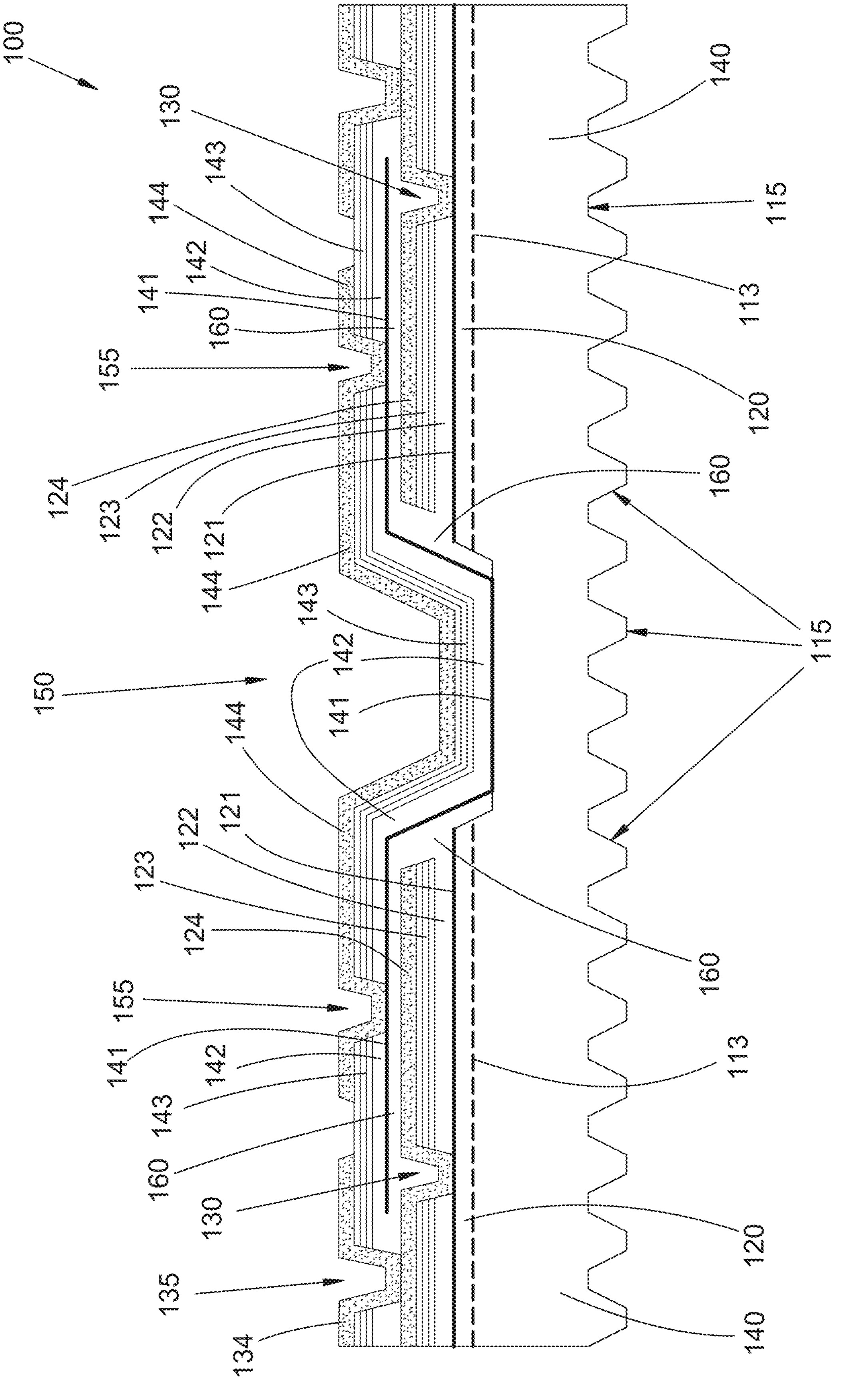
FIG. 3 is a schematic cross-sectional view of a second example of an inventive chip-scale package LED.
Figure 4:
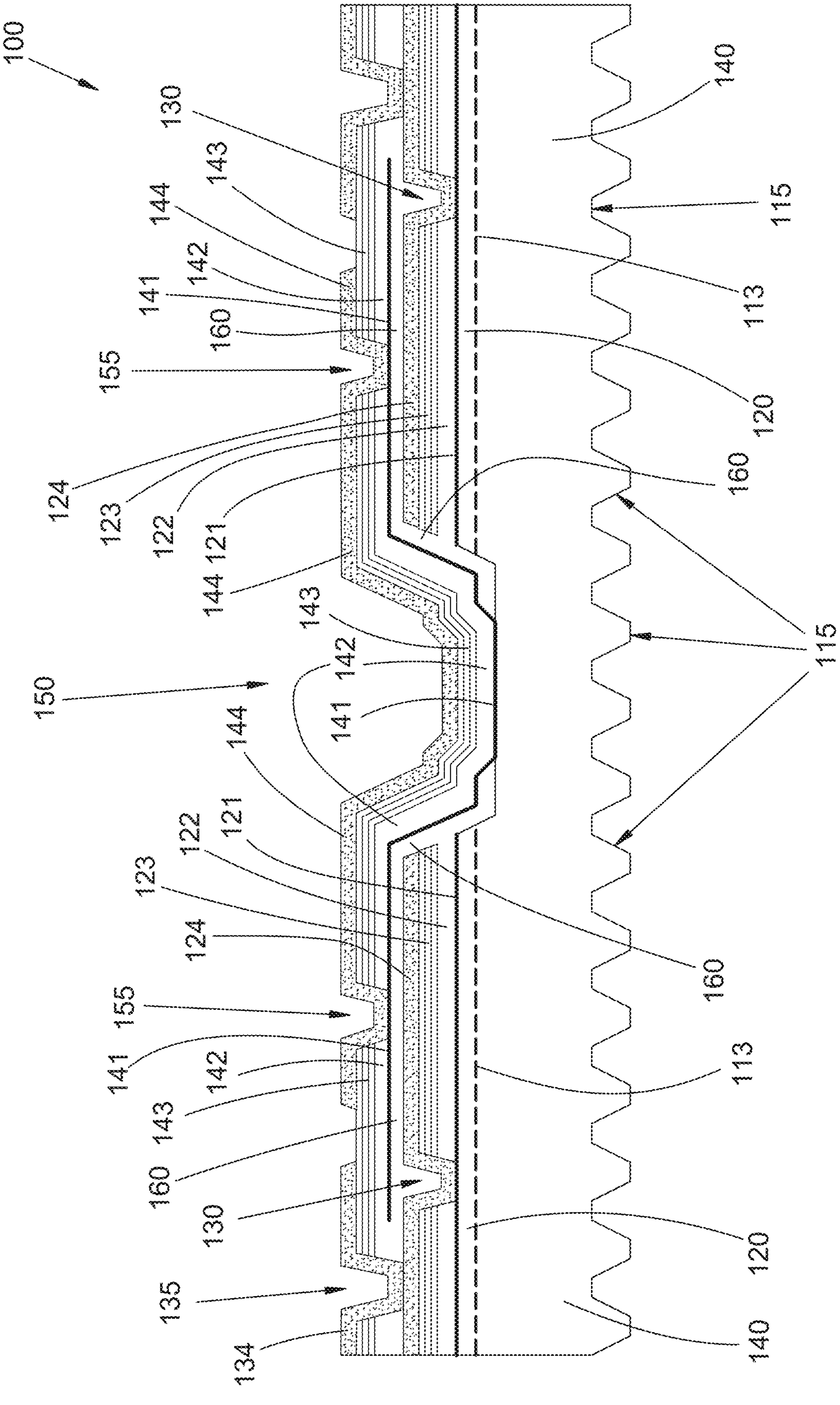
FIG. 4 is a schematic cross-sectional view of a third example of an inventive chip-scale package LED.
Figure 5:
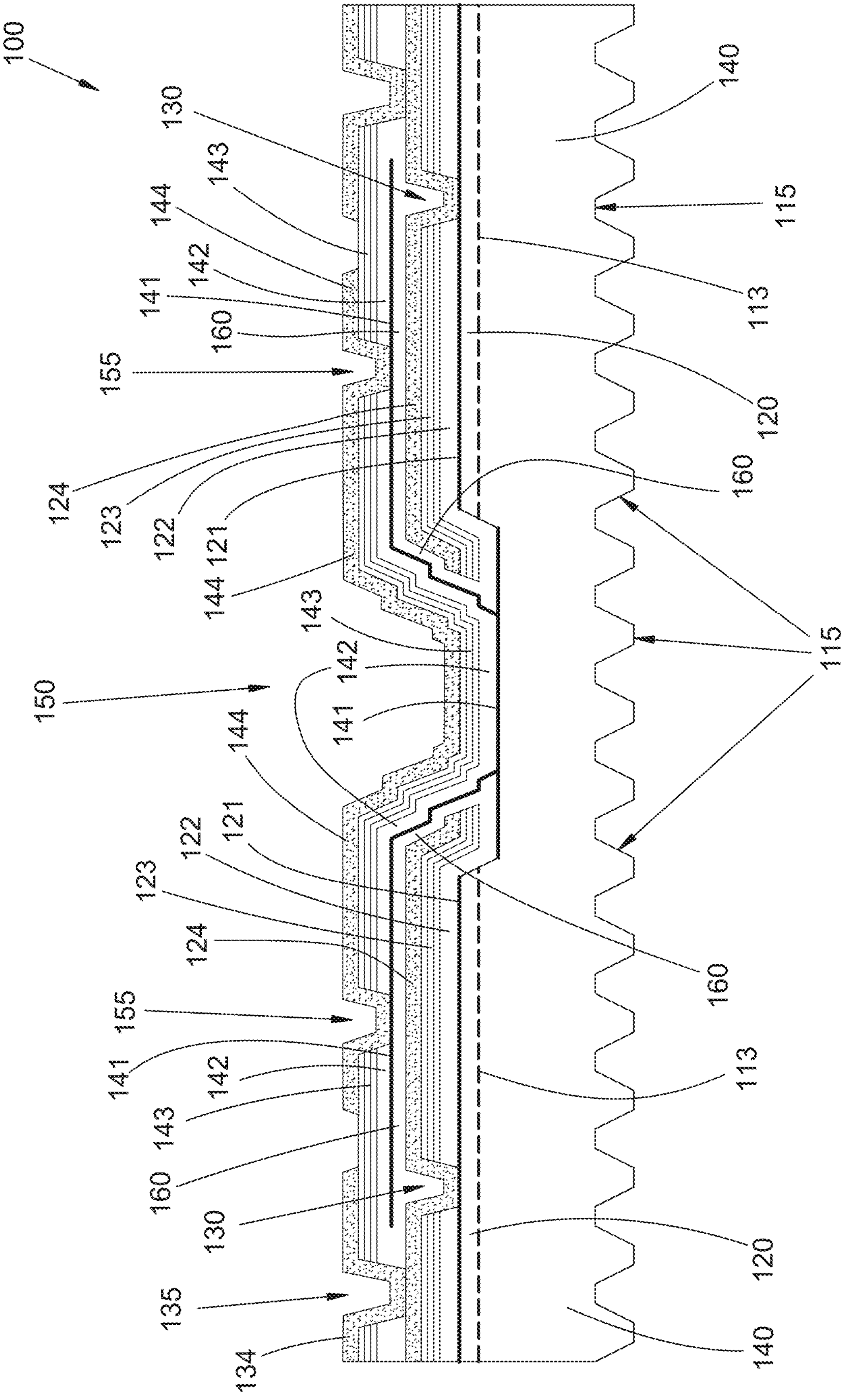
FIG. 5 is a schematic cross-sectional view of a fourth example of an inventive chip-scale package LED.

The embodiments depicted are shown only schematically; all features may not be shown in full detail or in proper proportion; for clarity certain features or structures may be exaggerated or diminished relative to others or omitted entirely; the drawings should not be regarded as being to scale unless explicitly indicated as being to scale. In the drawings (e.g., in FIGS. 1 through 5), some schematic illustrations of example structures of various devices and assemblies described herein may be shown with precise right angles, sharp corners, or straight lines, but it is to be understood that such schematic illustrations may not reflect real-life process limitations or defects. Such process limitations or defects can cause the features to look not so "ideal" when any of the structures described herein are examined using, e.g., scanning electron microscopy (SEM) images or transmission electron microscope (TEM) images. In such images of real structures, possible processing limitations or defects might be visible, e.g., not-perfectly straight edges of materials, tapered vias or other openings, inadvertent rounding of corners or variations in thicknesses of different material layers. There may be other limitations or defects not listed here that can occur within the field of device fabrication. Such non-ideal structures shall nevertheless fall within the scope of the present disclosure or claims. The embodiments shown are only examples and should not be construed as limiting the scope of the present disclosure or appended claims.

DETAILED DESCRIPTION

The following detailed description should be read with reference to the drawings, in which identical reference numbers refer to like elements throughout the different figures. The drawings, which are not necessarily to scale, depict selective examples and are not intended to limit the scope of the inventive subject matter. The detailed description illustrates by way of example, not by way of limitation, the principles of the inventive subject matter.

The following detailed description should be read with reference to the drawings, in which identical reference numbers refer to like elements throughout the different figures. The drawings, which are not necessarily to scale, depict selective examples and are not intended to limit the scope of the inventive subject matter. The detailed description illustrates by way of example, not by way of limitation, the principles of the inventive subject matter. For purposes of simplicity and clarity, detailed descriptions of well-known devices, circuits, and methods may be omitted so as not to obscure the description of the inventive subject matter with unnecessary detail. For purposes of the present disclosure and appended claims, any arrangement of a layer, surface, substrate, diode structure, or other structure "on," "over," or "against" another such structure shall encompass arrangements with direct contact between the two structures as well as arrangements including some intervening structure between them. Conversely, any arrangement of a layer, surface, substrate, diode structure, or other structure "directly on," "directly over," or "directly against" another such structure shall encompass only arrangements with direct contact between the two structures.

An observed disadvantage of the conventional CSP LED 10 of FIG. 1 is loss of luminance from the non-emitting areas of the LED, e.g., from the areas of the n-vias 50. Not only is no light emitted from those areas, but a significant fraction of light propagating into those areas can be absorbed by the metal layer 44 in contact with the n-doped layer 40, rather than being reflected toward the output surface 15 of the n-doped layer 40. Not only is overall luminance of the LED reduced, but the n-vias 50 also can appear as dimmed or darkened regions within the overall light-emitting area of the LED 10.

It would be desirable to increase overall luminance of a chip-scale package LED, or to reduce or eliminate the appearance of dimmed or darkened regions within the overall light-emitting area of the LED. Accordingly, inventive arrangements of a chip-scale package LED are disclosed herein that include additional reflective structures, and alternative arrangements of the n-vias, that can increase the overall luminance of the LED, or can reduce or eliminate the appearance of dimmed or darkened regions within the light-emitting area of the LED.

Examples of inventive arrangements of a chip-scale package LED 100 are illustrated schematically in FIGS. 2-5; each of those drawings is a schematic cross-section showing only a portion of the LED 100, and only one or two each of primary p-vias 130, secondary p-vias 135, primary n-vias 150, and secondary n-vias 155. A plan view of any of those examples would show sets of multiple vias of each of those types arranged in any suitable way across the light-emitting area of the LED 100 (e.g., regular, irregular, uniform spacing, variable spacing, etc.). Each via is a hole or opening that defines a localized, often circumscribed area where electrical contact is made between two layers that are otherwise separated in regions away from the via by one or more intervening electrically insulating layers; the via extends through those intervening insulating layers to enable the electrical contact, often being at least partly filled with metal or other electrically conductive material. Such vias are sometimes circular in transverse cross section, but can be any suitable symmetric, asymmetric, elliptical, polygonal, or elongated (i.e., trench-like) cross-sectional shape. Vias far from an edge of the LED typically would be entirely surrounded by the intervening electrically insulating layers (i.e., entirely circumscribed); vias at an edge of the LED might not be entirely surrounded by material of the intervening electrically insulating layers, but nevertheless provide a localized electrical connection between two layers.

An inventive LED 100 includes an n-doped semiconductor layer 140, a p-doped semiconductor layer 120, and an active region 113 between them, collectively forming a diode structure. The active region 113 emits light resulting from radiative recombination of charge carriers of an LED drive current flowing through the LED 100, and can include, e.g., one or more p-n junctions, one or more quantum wells, one or more multi-quantum wells, or one or more quantum dots. The n-doped layer 140, the p-doped layer 120, and the active region 113 can include any one or more semiconductor materials, including, e.g., one or more doped or undoped III-V, II-VI, of Group IV semiconductor materials or alloys or mixtures thereof. In the example embodiments shown and described the layer 120 is the p-doped layer and the layer 140 is the n-doped layer. However, the present disclosure shall also encompass embodiments wherein the layer 120 is an n-doped layer and the layer 140 is a p-doped layer. In such embodiments, the n-vias identified below would instead be p-vias, and vice versa. The LED 100 can be arranged to emit light at any suitable or desirable ultraviolet, visible, or infrared wavelength; in many examples the LED 100 emits visible light. The LED 100 can be operated as a direct emitter (in which the light emitted by the active region 113 forms the output light of the device) or can be operated as a so-called phosphor-converted emitter (in which some or all light emitted by the active region 113 is absorbed by one or more phosphor materials, which in turn emit at longer wavelength(s); the output of the device includes light at one or more such longer wavelengths, and in some instances can also include light at the wavelength emitted by the active region 113).

The inventive LED 100 further includes several sets of layers. In some example a first composite layer includes: (i) a transparent conductive oxide (TCO) layer 121 directly on the p-doped layer 120, (ii) a transparent dielectric layer 122 directly on the TCO layer 121, (iii) a multilayer reflector (MLR) layer 123 directly on the dielectric layer 122, and (iv) a metal layer 124 directly on the MLR layer 123. Thus arranged, the first composite layer 121/122/123/124 acts an electrical contact to the p-doped layer 120 and as an optical reflector. One or more primary n-vias 150 extend through the first composite layer 121/122/123/124, the p-doped layer 120, and the active region 113, and partly into the n-doped layer 140.

A second composite layer includes: (i) a transparent conductive oxide (TCO) layer 141 directly on and in electrical contact with the n-doped layer 140 within each primary n-via 150, (ii) a transparent dielectric layer 142 directly on the TCO layer 141, (iii) a MLR layer 143 directly on the dielectric layer 142, and (iv) a metal layer 144 directly on portions of the MLR layer 143. Thus arranged, the second composite layer 141/142/143/144 acts an electrical contact to the n-doped layer 140 within each n-via and as an optical reflector. The TCO layer 141 includes one or more embedded electrical contact areas outside the one or more primary n-vias 150. A transparent dielectric spacer layer 160 separates the first composite layer 121/122/123/124, the p-doped layer 120, and the active region 113 from the second composite layer 141/142/143/144. Each embedded electrical contact area of the TCO layer 141 is separated from the p-doped layer by portions of the first composite layer 121/122/123/124 and the dielectric spacer layer 160.

Each of the TCO layers 121 or 141 can include any one or more suitable transparent conductive oxide materials, e.g., indium tin oxide (ITO) or indium zinc oxide (IZO). Each of the dielectric layers 122 or 142, or the dielectric spacer layer 160, can comprise any one or more suitable transparent (at the wavelength of interest) dielectric materials, including, e.g., one or more metal or semiconductor oxides, nitride, or oxynitrides (any of which can be doped or undoped, as needed or desired). Each of the MLR layers 123 or 143 can comprise any suitable multilayer reflector structure made with any one or more suitable materials, e.g., a distributed Bragg reflector (DBR) or a multilayer interference coating. Each of the metal layers 124 or 144 can include any one or more suitable metals or alloys, including, e.g., aluminum, silver, gold, titanium, tungsten, or platinum. In some instances, a metal layer 124 or 144 can include multiple layers of different metals, e.g., a thin layer of titanium/tungsten alloy to prevent migration of silver atoms, or a thin layer of titanium to form an ohmic contact between a semiconductor layer and another metal.

In some examples, one or more primary p-vias 130 can extend through the dielectric layer 122 and the MLR layer 123 of the first composite layer. Material of the metal layer 124 can at least partly fill each primary p-via 130 so that the TCO layer 121 is in direct electrical contact with the metal layer 124 within each primary p-via 130. In some examples, one or more secondary p-vias 135 can extend through the dielectric spacer layer 160 and the TCO layer 141, dielectric layer 142, and MLR layer 143 of the second composite layer. A metal layer 134 can at least partly fill each secondary p-via 135 and is in direct electrical contact with the metal layer 124 within each secondary p-via 135. Each secondary p-via 135 is electrically isolated from the TCO layer 141 and the metal layer 144. The metal layer 134 can serve as a p-contact for the LED 100; LED drive current can flow between the p-doped layer 120 and the metal layer 134 via the TCO layer 121 and the metal layer 124.

The TCO layer 141, dielectric layer 142, MLR layer 143, and metal layer 144 of the second composite layer extend into each primary n-via 150 to cover its interior surfaces. The TCO layer 141 is in direct electrical contact with the n-doped layer 140 within each primary n-via 150. The dielectric spacer layer 160 extends into each primary n-via 150 and separates the TCO layer 141 from the active region 113, the p-doped layer 120, the TCO layer 121, and the metal layer 124. In some examples, one or more secondary n-vias 155 can extend through the dielectric layer 142 and the MLR layer 143. Material of the metal layer 144 can at least partly fill each secondary n-via 155 so that the TCO layer 141 is in direct electrical contact with the metal layer 144 within each secondary n-via 155 at a corresponding embedded electrical contact area of the TCO layer 141. The metal layer 144 can serve as an n-contact for the LED 100; LED drive current can flow between the n-doped layer 140 and the metal layer 144 via the TCO layer 141.

In some examples the dielectric layer 122, MLR layer 123, and metal layer 124 of the first composite layer can form a first composite reflector. In a manner similar to the conventional LED 10 of FIG. 1, the first composite reflector of the LED 100 of FIGS. 2-5 (*i*) is positioned between the active region 113 and the metal layers 144 and 134 and (ii) reflects at least some light emitted by the active region 113 that propagates within the p-doped layer 120 to propagate toward the exit surface 115 of the n-doped layer 140.

The dielectric layer 142, MLR layer 143, and metal layer 144 of the second composite layer can form a second composite reflector, within each primary n-via 150, that reflects at least some light emitted by the active region 113 that propagates within the n-doped layer 140 to propagate toward the exit surface 115 of the n-doped layer 140. In some examples, the first and second composite reflectors are arranged so that every areal portion of the LED 100 includes corresponding portions of one or both of the first or second composite reflectors.

The second composite reflector can act to mitigate the disadvantages mentioned above for the conventional arrangement of LED 10 in FIG. 1. Absorption of emitted light by the metal layer 44 within the n-via 50 (in the conventional arrangement of FIG. 1) can be reduced or eliminated, and overall luminance can be increased, by interposing the TCO layer 141, dielectric layer 142, and MLR layer 143 of the second composite layer between the n-doped layer 140 and the metal layer 144 (in the inventive arrangement of FIGS. 2-5). In additional, overall reflectivity of the LED 100 can be increased, and overall luminance can be further increased, by the presence of the second composite reflector (i.e., dielectric layer 142, MLR layer 143, and metal layer 144) spanning each primary n-via 150. The second composite reflector directs some emitted light toward the output surface 115 of the n-doped layer 140 that might otherwise have been lost. Overall reflectivity of the LED 100 can be maximized by ensuring that any areal portion of the LED 100 includes a corresponding portion of at least one of the composite reflectors; some areal portions might include corresponding portions of both composite reflectors. In addition, the presence of the second composite reflector spanning each primary n-via 150 can reduce or eliminate the appearance of darkened or dimmed regions of the LED 100 caused by the presence of the primary n-vias 150. Instead of being regions where light is absorbed (as in the conventional arrangement), the presence of the second composite reflector can cause at least some emitted light to appear to emanate from the regions of the primary n-vias 150.

In some examples (e.g., as in FIG. 2), the LED 100 can be arranged so that, within each primary n-via 150, edges of the active region 113, the p-doped layer 120, the TCO layer 121, the MLR layer 123, and the metal layer 124 are separated from the TCO layer 141 by a uniform thickness of the spacer dielectric layer 160. In some other examples (e.g., as in FIG. 3), the LED 100 can be arranged so that, within each primary n-via 150: (i) edges of the active region 113, the p-doped layer 120, and the TCO layer 121 are separated from the TCO layer 141 by a first thickness of the spacer dielectric layer 160, and (ii) edges of the MLR layer 123 and the metal layer 124 are separated from the TCO layer 141 by a second thickness of the spacer dielectric layer 160 that is greater than the first thickness of the dielectric spacer layer 160. In some examples (e.g., as in FIG. 4), the LED 100 can be arranged so that the dielectric layer 122 or the dielectric spacer layer 160 extends partly across a bottom of each primary n-via 150 between portions of the n-doped layer 140 and the TCO layer 141.

In some examples (e.g., as in FIG. 5), the dielectric layer 122, MLR layer 123, and metal layer 124 of the first composite layer can extend partly into each primary n-via 150 between the dielectric spacer layer 160 and edges of the TCO layer 121, the active region 113, and the p-doped layer 120, with the dielectric layer 122 also extending partly across a bottom of each primary n-via 150. In some of those examples, the MLR layer 123 and the metal layer 124 can also extend partly across each primary n-via 150 between the dielectric layer 122 and the dielectric spacer layer 160. In some of those examples, a portion of the TCO layer 141 can extend between the n-doped layer 140 and the dielectric layer 122 within each primary n-via 150.

A method for operating the LED 100 includes connecting the metal layer 144 and the metal layer 134 to corresponding connections of an LED drive current source. The metal layer 144 is electrically connected to the n-doped layer 140 (via the TCO layer 141), and so would be connected to the cathode connection of the LED drive current source; the metal layer 134 is electrically connected to the p-doped layer 120 (via the metal layer 124 and the TCO layer 121), and so would be connected to the anode connection of the LED drive current source. The method further includes, using the LED drive current source, causing drive current to flow between the metal layer 144 and the metal layer 134 through the LED 100, resulting in light emission by the active region 113 of the LED 100.

Any suitable spatially selective material processing techniques can be employed for forming the LED 100. Each layer can be formed by any suitable process or technique, e.g., growth or deposition; and hole or via can be formed by any suitable process or technique, e.g., dry or wet etching. One example procedure is as follows.

First, (i) the TCO layer 121 is formed directly on the p-doped layer 120 of the diode structure, (ii) the dielectric layer 122 is formed directly on the TCO layer 121, and (iii) the MLR layer 123 is formed directly on the dielectric layer 122. Next, the one or more primary p-vias 130 are formed through the MLR layer 122 and first dielectric layer 122. Next, the metal layer 124 is formed directly on the MLR layer 123, at least partly filling each primary p-via 130 with material of the metal layer 124 so that the TCO layer 121 is in direct electrical contact with the metal layer 124 within each primary p-via 130. Next, the one or more primary n-vias 150 are formed through the metal layer 124, the MLR layer 123, the dielectric layer 122, the TCO layer 121, the p-doped layer 120, and the active region 113, and partly into the n-doped layer 140.

Next, the dielectric spacer layer 160 is formed directly on the metal layer 124 and extending into each primary n-via 150 over edges or lateral portions of the metal layer 124, the MLR layer 123, and the TCO layer 121. Next, the TCO layer 141 is formed directly on the dielectric spacer layer 160 and on the n-doped layer 140 within each primary n-via 150. The TCO layer 141 is in direct electrical contact with the n-doped layer 140, and the dielectric spacer layer 160 separates the TCO layer 141 from the active region 113, the p-doped layer 120, the TCO layer 121, and the metal layer 124. Next, holes are formed through the TCO layer 141 at the locations of the secondary p-vias 135; each hole is larger than the corresponding secondary p-via 135. Next, the dielectric layer 142 is formed directly on the TCO layer 141 and over the holes therethrough, and the MLR layer 143 is formed directly on the dielectric layer 142.

The one or more secondary n-vias 135 are formed through the MLR layer 143 and the dielectric layer 142. The metal layer 144 is formed directly on portions of the MLR layer 143, including those portions within each primary n-via 150, at least partly filling each secondary n-via 155 with material of the metal layer 144 so that the TCO layer 141 is in direct electrical contact with the metal layer 144 within each secondary n-via 155 at a corresponding embedded contact areas of the TCO layer 141. The one or more secondary p-vias 135 are formed through the MLR layer 143, the dielectric layer 142, the holes in the TCO layer 141, and the dielectric spacer layer 160. The metal layer 134 is formed directly on portions of the MLR layer 143, at least partly filling each secondary p-via 135 with material of the metal layer 134 so that the metal layer 124 is in direct electrical contact with the metal layer 134 within each secondary p-via 135. The metal layer 134 remains electrically isolated from the TCO layer 141 and the metal layer 144.

In addition to the preceding, the following example embodiments fall within the scope of the present disclosure or appended claims. Any given Example below that refers to multiple preceding Examples shall be understood to refer to only those preceding Examples with which the given Example is not inconsistent, and to exclude implicitly those preceding Examples with which the given Example is inconsistent.

Example 1. A light-emitting diode (LED) comprising: (a) a diode structure that comprises a first doped semiconductor layer, a second doped semiconductor layer, and an active region therebetween, the active region emitting light resulting from radiative recombination of charge carriers of an LED drive current, a surface of the second doped semiconductor layer forming a light-output surface of the diode structure; (b) a first composite layer positioned directly on the first doped layer and structured so as to act as an electrical contact to the first doped layer and as an optical reflector; (c) a set of one or more primary vias that extend through the first composite layer, the first doped layer, and the active region, and partly into the second doped layer; (d) a second composite layer positioned directly on the second doped layer within the one or more primary vias, on lateral surfaces of the one or more primary vias, and on portions of the first composite layer outside the one or more primary vias, and structured so as to act as an electrical contact to the second doped layer and as an optical reflector, the second composite layer comprising (i) a transparent conductive oxide (TCO) layer directly on and in direct electrical contact with the second doped layer within the one or more primary vias, (ii) a dielectric layer directly on the TCO layer, (iii) a multilayer reflector (MLR) layer directly on the dielectric layer, and (iv) a metal layer directly on the MLR layer; and (e) a dielectric spacer layer that separates the first composite layer, the first doped layer, and the active region from the second composite layer, (f) wherein the TCO layer of the second composite layer includes one or more embedded electrical contact areas outside the one or more primary vias, each embedded electrical contact area being separated from the first doped layer by portions of the first composite layer and the dielectric spacer layer.

Example 2. The LED of Example 1 wherein: (a') the first doped layer comprises a p-doped semiconductor layer, and the second doped layer comprises an n-doped semiconductor layer; (b') the first composite layer comprises a TCO layer directly on and in direct electrical contact with the p-doped layer, a transparent dielectric layer directly on the TCO layer of the first composite layer, an MLR layer directly on the dielectric layer of the first composite layer, and a metal layer directly on the MLR layer of the first composite layer, and further comprises one or more primary p-vias that extend through the dielectric and MLR layers of the first composite layer and are filled with material of the metal layer of the first composite layer so that the metal and TCO layers of the first composite layer are in electrical contact within each primary p-via; and (c') each of the one or more primary vias is a primary n-via, with the TCO layer of the second composite layer being in direct electrical contact with the n-doped layer within each of the one or more primary n-vias.

Example 3. The LED of Example 2 further comprising: (g) one or more secondary p-vias that extend through the dielectric spacer and the TCO, dielectric, and MLR layers of the second composite layer, wherein (i) metal at least partly fills each secondary p-via and is in direct electrical contact with the metal layer of the first composite layer within each secondary p-via, and (ii) the metal within each secondary p-via is electrically isolated from the TCO and metal layers of the second composite layer; and (h) one or more secondary n-vias that extend through the dielectric and MLR layers of the second composite layer, wherein metal at least partly fills each secondary n-via so that the TCO and metal layers of the second composite layer are in direct electrical contact within each secondary n-via at the one or more embedded electrical contact areas.

Example 4. The LED of any one of Examples 2 or 3 wherein, within each primary n-via, edges of the active region, the p-doped layer, and the TCO, MLR, and metal layers of the first composite layer are separated from the TCO layer of the second composite layer by a uniform thickness of the dielectric spacer layer.

Example 5. The LED of any one of Examples 2 or 3 wherein, within each primary n-via: (i) edges of the active region, the p-doped layer, and the TCO layer of the first composite layer are separated from the TCO layer of the second composite layer by a first thickness of the dielectric spacer layer, and (ii) edges of the MLR and metal layers of the first composite layer are separated from the TCO layer of the second composite layer by a second thickness of the dielectric spacer layer that is greater than the first thickness of the dielectric spacer layer.

Example 6. The LED of any one of Examples 2 or 3 wherein the dielectric layer of the first composite layer or the dielectric spacer layer extends partly across a bottom of each primary n-via between portions of the n-doped layer and the TCO layer of the second composite layer.

Example 7. The LED of any one of Examples 2 or 3 wherein the dielectric, MLR, and metal layers of the first composite layer extend partly into each primary n-via between the dielectric spacer layer and edges of the TCO layer of the first composite layer, the active region, and the p-doped layer, with the dielectric layer of the first composite layer also extending partly across a bottom of each primary n-via.

Example 8. The LED of Example 7 wherein the MLR and metal layers of the first composite layer extend partly across each primary n-via between the dielectric layer of the first composite layer and the dielectric spacer layer.

Example 9. The LED of Example 7 wherein a portion of the TCO layer of the second composite layer extends between the n-doped layer and the dielectric layer of the first composite layer within each primary n-via.

Example 10. The LED of any one of Examples 2 through 9 wherein the dielectric, MLR, and metal layers of the first composite layer form a composite reflector that reflects at least some light emitted by the active region that propagates within the p-doped layer to propagate toward an exit surface of the n-doped layer.

Example 11. The LED of any one of Examples 2 through 10 wherein the dielectric, MLR, and metal layers of the second composite layer form a composite reflector within each n-via that reflects at least some light emitted by the active region that propagates within the n-doped layer to propagate toward an exit surface of the n-doped layer.

Example 12. The LED of any one of Examples 2 through 11 wherein (i) the dielectric, MLR, and metal layers of the first composite layer form a first composite reflector, (ii) the dielectric, MLR, and metal layers of the second composite layer form a second composite reflector, and (iii) every areal portion of the LED includes portions of one or both of the first or second composite reflectors.

Example 13. The LED of any one of Examples 2 through 12, each of the n-doped layer, the p-doped layer, and the active region including one or more III-V semiconductor materials, or alloys or mixtures thereof.

Example 14. The LED of any one of Examples 2 through 13, the active region including one or more p-n junctions, one or more quantum wells, one or more multi-quantum wells, or one or more quantum dots.

Example 15. The LED of any one of Examples 2 through 14, each of the of the dielectric layer of the first composite layer, the dielectric layer of the second composite layer, or the dielectric spacer layer including one or more metal or semiconductor oxides, nitrides, or oxynitrides.

Example 16. The LED of any one of Examples 2 through 15, each of the TCO layers of the first or second composite layers including one or more of indium tin oxide (ITO) or indium zinc oxide (IZO).

Example 17. The LED of any one of Examples 2 through 16, the metal layers of the first or second composite layers including one or more of aluminum, silver, gold, titanium, tungsten, or platinum.

Example 18. The LED of any one of Examples 2 through 17, each of the of the MLR layers of the first or second composite layers including a distributed Bragg reflector or a multilayer interference coating.

Example 19. A method for operating the LED of any one of Examples 2 through 18, the method comprising: (A) connecting the metal layer of the second composite layer to a cathode connection of an LED drive current source; (B) connecting the metal layer of the first composite layer to an anode connection of the LED drive current source; and (C) using the LED drive current source, causing drive current to flow between the metal layers of the first and second composite layers through the LED, resulting in light emission by the active region of the LED.

Example 20. The method for making the LED of any one of Examples 2 through 18, the method comprising: (A) forming the TCO, dielectric, and MLR layers of the first composite layer; (B) forming the one or more primary p-vias through the MLR and dielectric layers of the first composite layer; (C) forming the metal layer of the first composite layer, at least partly filling each primary p-via with metal; (D) forming the one or more primary n-vias through the metal, MLR, dielectric, and TCO layers of the first composite layer, the p-doped layer, and the active region, and partly into the n-doped layer; (E) forming the dielectric spacer layer directly on the metal layer of the first composite layer and extending into each primary n-via over edges or lateral portions of the metal, MLR, and TCO layers of the first composite layer, the p-doped layer, and the active region; and (F) forming the TCO, dielectric, MLR, and metal layers of the second composite layer directly on the dielectric spacer layer and on the n-doped layer within each primary n-via, with the TCO layer of the second composite layer in direct electrical contact with the n-doped layer, and with the dielectric spacer layer separating the TCO layer of the second composite layer from the active region, the p-doped layer, and the TCO and metal layers of the first composite layer.

This disclosure is illustrative and not limiting. Further modifications will be apparent to one skilled in the art in light of this disclosure and are intended to fall within the scope of the present disclosure or appended claims. It is intended that equivalents of the disclosed example embodiments and methods, or modifications thereof, shall fall within the scope of the present disclosure or appended claims.

In the foregoing Detailed Description, various features may be grouped together in several example embodiments for the purpose of streamlining the disclosure. This method of disclosure is not to be interpreted as reflecting an intention that any claimed embodiment requires more features than are expressly recited in the corresponding claim. Rather, as the appended claims reflect, inventive subject matter may lie in less than all features of a single disclosed example embodiment. Therefore, the present disclosure shall be construed as implicitly disclosing any embodiment having any suitable subset of one or more features-which features are shown, described, or claimed in the present application-including those subsets that may not be explicitly disclosed herein. A "suitable" subset of features includes only features that are neither incompatible nor mutually exclusive with respect to any other feature of that subset. Accordingly, the appended claims are hereby incorporated in their entirety into the Detailed Description, with each claim standing on its own as a separate disclosed embodiment. In addition, each of the appended dependent claims shall be interpreted, only for purposes of disclosure by said incorporation of the claims into the Detailed Description, as if written in multiple dependent form and dependent upon all preceding claims with which it is not inconsistent. It should be further noted that the cumulative scope of the appended claims can, but does not necessarily, encompass the whole of the subject matter disclosed in the present application.

The following interpretations shall apply for purposes of the present disclosure and appended claims. The words "comprising," "including," "having," and variants thereof, wherever they appear, shall be construed as open ended terminology, with the same meaning as if a phrase such as "at least" were appended after each instance thereof, unless explicitly stated otherwise. The article "a" shall be interpreted as "one or more" unless "only one," "a single," or other similar limitation is stated explicitly or is implicit in the particular context; similarly, the article "the" shall be interpreted as "one or more of the" unless "only one of the," "a single one of the," or other similar limitation is stated explicitly or is implicit in the particular context. The conjunction "or" is to be construed inclusively unless: (i) it is explicitly stated otherwise, e.g., by use of "either . . . or," "only one of," or similar language; or (ii) two or more of the listed alternatives are understood or disclosed (implicitly or explicitly) to be incompatible or mutually exclusive within the particular context. In that latter case, "or" would be understood to encompass only those combinations involving non-mutually-exclusive alternatives. In one example, each of "a dog or a cat," "one or more of a dog or a cat," and "one or more dogs or cats" would be interpreted as one or more dogs without any cats, or one or more cats without any dogs, or one or more of each.

For purposes of the present disclosure or appended claims, when a numerical quantity is recited (with or without terms such as "about," "about equal to," "substantially equal to," "greater than about," "less than about," and so forth), standard conventions pertaining to measurement precision, rounding error, and significant digits shall apply, unless a differing interpretation is explicitly set forth, or if a differing interpretation is implicit or inherent (e.g., some small integer quantities). For null quantities described by phrases such as "equal to zero," "absent," "eliminated," "negligible," "prevented," and so forth (with or without terms such as "about," "substantially," and so forth), each such phrase shall denote the case wherein the quantity in question has been reduced or diminished to such an extent that, for practical purposes in the context of the intended operation or use of the disclosed or claimed apparatus or method, the overall behavior or performance of the apparatus or method does not differ from that which would have occurred had the null quantity in fact been completely removed, exactly equal to zero, or otherwise exactly nulled. Terms such as "parallel," "perpendicular," "orthogonal," "flush," "aligned," and so forth shall be similarly interpreted (with or without terms such as "about," "substantially," and so forth).

For purposes of the present disclosure and appended claims, any labelling of elements, steps, limitations, or other portions of an embodiment, example, or claim (e.g., first, second, third, etc., (a), (b), (c), etc., or (i), (ii), (iii), etc.) is only for purposes of clarity, and shall not be construed as implying any sort of ordering or precedence of the portions so labelled. If any such ordering or precedence is intended, it will be explicitly recited in the embodiment, example, or claim or, in some instances, it will be implicit or inherent based on the specific content of the embodiment, example, or claim. In the appended claims, if the provisions of 35 USC § 112 (f) are desired to be invoked in an apparatus claim, then the word "means" will appear in that apparatus claim. If those provisions are desired to be invoked in a method claim, the words "a step for" will appear in that method claim. Conversely, if the words "means" or "a step for" do not appear in a claim, then the provisions of 35 USC § 112 (f) are not intended to be invoked for that claim.

If any one or more disclosures are incorporated herein by reference and such incorporated disclosures conflict in part or whole with, or differ in scope from, the present disclosure, then to the extent of conflict, broader disclosure, or broader definition of terms, the present disclosure controls. If such incorporated disclosures conflict in part or whole with one another, then to the extent of conflict, the later-dated disclosure controls.

The Abstract is provided as required as an aid to those searching for specific subject matter within the patent literature. However, the Abstract is not intended to imply that any elements, features, or limitations recited therein are necessarily encompassed by any particular claim. The scope of subject matter encompassed by each claim shall be determined by the recitation of only that claim.

What is claimed is:

1. A light-emitting diode (LED) comprising:

(a) a diode structure that comprises a first doped semiconductor layer, a second doped semiconductor layer, and an active region therebetween, the active region emitting light resulting from radiative recombination of charge carriers of an LED drive current, a surface of the second doped semiconductor layer forming a light-output surface of the diode structure;

(b) a first composite layer positioned directly on the first doped layer and structured so as to act as an electrical contact to the first doped layer and as an optical reflector;

(c) a set of one or more primary vias that extend through the first composite layer, the first doped layer, and the active region, and partly into the second doped layer;

(d) a second composite layer positioned directly on the second doped layer within the one or more primary vias, on lateral surfaces of the one or more primary vias, and on portions of the first composite layer outside the one or more primary vias, and structured so as to act as an electrical contact to the second doped layer and as an optical reflector, the second composite layer comprising (i) a transparent conductive oxide (TCO) layer directly on and in direct electrical contact with the second doped layer within the one or more primary vias, (ii) a dielectric layer directly on the TCO layer, (iii) a multilayer reflector (MLR) layer directly on the dielectric layer, and (iv) a metal layer directly on the MLR layer; and (e) a dielectric spacer layer that separates the first composite layer, the first doped layer, and the active region from the second composite layer, (f) wherein the TCO layer of the second composite layer includes one or more embedded electrical contact areas outside the one or more primary vias, each embedded electrical contact area being separated from the first doped layer by portions of the first composite layer and the dielectric spacer layer.

2. The LED of claim 1 wherein:

(a') the first doped layer comprises a p-doped semiconductor layer, and the second doped layer comprises an n-doped semiconductor layer;

(b') the first composite layer comprises a TCO layer directly on and in direct electrical contact with the p-doped layer, a transparent dielectric layer directly on the TCO layer of the first composite layer, an MLR layer directly on the dielectric layer of the first composite layer, and a metal layer directly on the MLR layer of the first composite layer, and further comprises one or more primary p-vias that extend through the dielectric and MLR layers of the first composite layer and are filled with material of the metal layer of the first composite layer so that the metal and TCO layers of the first composite layer are in electrical contact within each primary p-via; and (c') each of the one or more primary vias is a primary n-via, with the TCO layer of the second composite layer being in direct electrical contact with the n-doped layer within each of the one or more primary n-vias.

3. The LED of claim 2 further comprising:

(g) one or more secondary p-vias that extend through the dielectric spacer and the TCO, dielectric, and MLR layers of the second composite layer, wherein (i) metal at least partly fills each secondary p-via and is in direct electrical contact with the metal layer of the first composite layer within each secondary p-via, and (ii) the metal within each secondary p-via is electrically isolated from the TCO and metal layers of the second composite layer; and (h) one or more secondary n-vias that extend through the dielectric and MLR layers of the second composite layer, wherein metal at least partly fills each secondary n-via so that the TCO and metal layers of the second composite layer are in direct electrical contact within each secondary n-via at the one or more embedded electrical contact areas.

4. The LED of claim 2 wherein, within each primary n-via, edges of the active region, the p-doped layer, and the TCO, MLR, and metal layers of the first composite layer are separated from the TCO layer of the second composite layer by a uniform thickness of the dielectric spacer layer.

5. The LED of claim 2 wherein, within each primary n-via: (i) edges of the active region, the p-doped layer, and the TCO layer of the first composite layer are separated from the TCO layer of the second composite layer by a first thickness of the dielectric spacer layer, and (ii) edges of the MLR and metal layers of the first composite layer are separated from the TCO layer of the second composite layer by a second thickness of the dielectric spacer layer that is greater than the first thickness of the dielectric spacer layer.

6. The LED of claim 2 wherein the dielectric layer of the first composite layer or the dielectric spacer layer extends partly across a bottom of each primary n-via between portions of the n-doped layer and the TCO layer of the second composite layer.

7. The LED of claim 2 wherein the dielectric, MLR, and metal layers of the first composite layer extend partly into each primary n-via between the dielectric spacer layer and edges of the TCO layer of the first composite layer, the active region, and the p-doped layer, with the dielectric layer of the first composite layer also extending partly across a bottom of each primary n-via.

8. The LED of claim 7 wherein the MLR and metal layers of the first composite layer extend partly across each primary n-via between the dielectric layer of the first composite layer and the dielectric spacer layer.

9. The LED of claim 7 wherein a portion of the TCO layer of the second composite layer extends between the n-doped layer and the dielectric layer of the first composite layer within each primary n-via.

10. The LED of claim 2 wherein the dielectric, MLR, and metal layers of the first composite layer form a composite reflector that reflects at least some light emitted by the active region that propagates within the p-doped layer to propagate toward an exit surface of the n-doped layer.

11. The LED of claim 2 wherein the dielectric, MLR, and metal layers of the second composite layer form a composite reflector within each n-via that reflects at least some light emitted by the active region that propagates within the n-doped layer to propagate toward an exit surface of the n-doped layer.

12. The LED of claim 2 wherein (i) the dielectric, MLR, and metal layers of the first composite layer form a first composite reflector, (ii) the dielectric, MLR, and metal layers of the second composite layer form a second composite reflector, and (iii) every areal portion of the LED includes portions of one or both of the first or second composite reflectors.

13. The LED of claim 2, each of the n-doped layer, the p-doped layer, and the active region including one or more III-V semiconductor materials, or alloys or mixtures thereof.

14. The LED of claim 2, the active region including one or more p-n junctions, one or more quantum wells, one or more multi-quantum wells, or one or more quantum dots.

15. The LED of claim 2, each of the of the dielectric layer of the first composite layer, the dielectric layer of the second composite layer, or the dielectric spacer layer including one or more metal or semiconductor oxides, nitrides, or oxynitrides.

16. The LED of claim 2, each of the TCO layers of the first or second composite layers including one or more of indium tin oxide (ITO) or indium zinc oxide (IZO).

17. The LED of claim 2, the metal layers of the first or second composite layers including one or more of aluminum, silver, gold, titanium, tungsten, or platinum.

18. The LED of claim 2, each of the of the MLR layers of the first or second composite layers including a distributed Bragg reflector or a multilayer interference coating.

19. A method for operating the LED of claim 2 comprising:

(A) connecting the metal layer of the second composite layer to a cathode connection of an LED drive current source;

(B) connecting the metal layer of the first composite layer to an anode connection of the LED drive current source; and (C) using the LED drive current source, causing drive current to flow between the metal layers of the first and second composite layers through the LED, resulting in light emission by the active region of the LED.

20. The method for making the LED of claim 2 comprising:

(A) forming the TCO, dielectric, and MLR layers of the first composite layer;

(B) forming the one or more primary p-vias through the MLR and dielectric layers of the first composite layer;

(C) forming the metal layer of the first composite layer, at least partly filling each primary p-via with metal;

(D) forming the one or more primary n-vias through the metal, MLR, dielectric, and TCO layers of the first composite layer, the p-doped layer, and the active region, and partly into the n-doped layer;

(E) forming the dielectric spacer layer directly on the metal layer of the first composite layer and extending into each primary n-via over edges or lateral portions of the metal, MLR, and TCO layers of the first composite layer, the p-doped layer, and the active region; and (F) forming the TCO, dielectric, MLR, and metal layers of the second composite layer directly on the dielectric spacer layer and on the n-doped layer within each primary n-via, with the TCO layer of the second composite layer in direct electrical contact with the n-doped layer, and with the dielectric spacer layer separating the TCO layer of the second composite layer from the active region, the p-doped layer, and the TCO and metal layers of the first composite layer.

* * * * *